United States Patent [19]

Hayakawa et al.

[11] Patent Number: 4,693,207
[45] Date of Patent: Sep. 15, 1987

[54] APPARATUS FOR THE GROWTH OF SEMICONDUCTOR CRYSTALS

[75] Inventors: Toshiro Hayakawa, Nara; Takahiro Suyama; Kohsei Takahashi, both of Tenri; Saburo Yamamoto, Nara, all of Japan

[73] Assignee: Sharp Kabushiki Kaisha, Osaka, Japan

[21] Appl. No.: 805,517

[22] Filed: Dec. 6, 1985

[30] Foreign Application Priority Data

Dec. 7, 1984 [JP] Japan ................. 59-259570

[51] Int. Cl.4 ............................. C23C 16/00
[52] U.S. Cl. .................... 118/715; 118/723; 156/DIG. 103
[58] Field of Search .............. 118/715, 723, 50, 50.1, 118/620; 156/611, DIG. 103, DIG. 80; 427/53.1

[56] References Cited

U.S. PATENT DOCUMENTS 4,434,189 2/1984 Zaplatynsky ............. 118/50.1
4,550,684 11/1985 Mahawili .................. 118/50.1
4,560,576 12/1985 Lewis et al. ............. 427/53.1
4,568,565 2/1986 Gupta et al. ............. 427/53.1

FOREIGN PATENT DOCUMENTS 59-126774 7/1984 Japan ..................... 118/715
60-128265 7/1985 Japan ..................... 427/39
1515571 5/1974 United Kingdom .
2012818 1/1979 United Kingdom .

Primary Examiner—John D. Smith
Assistant Examiner—Vi Duong Dang
Attorney, Agent, or Firm—Armstrong, Nikaido, Marmelstein & Kubovcik

[57] ABSTRACT

An apparatus for the growth of semiconductor crystals in which the surface of a substrate is irradiated with molecular beam containing elements by which semiconductor thin films are formed on the substrate within a molecular beam epitaxial growth chamber in a high vacuum, thereby achieving molecular beam epitaxial growth of semiconductor thin films onto the substrate, wherein said molecular beam epitaxial growth chamber comprises an optical window through which light is introduced into said growth chamber and irradiates the surface of said substrate during molecular beam epitaxial growth.

1 Claim, 1 Drawing Figure

APPARATUS FOR THE GROWTH OF SEMICONDUCTOR CRYSTALS

BACKGROUND OF THE INVENTION

1. Field of the Invention

This invention relates to an apparatus for molecular beam epitaxial growth of semiconductor crystals.

2. Description of the Prior Art

In recent years, attention has been paid to molecular beam epitaxy (MBE) as a high crystal growth technique using the quantum effect for the production of devices such as quantum-well semiconductor lasers and high-electron-mobility transistors (HEMT). Molecular beam epitaxy produces growth layers with a thickness that can be controlled more accurately to the level of layers of molecules than liquid phase epitaxy (LPE). Moreover, the growth layers obtained by molecular beam epitaxy are excellent in the uniformity of the thickness distribution on the surface thereof, so that semiconductor devices having excellent characteristics can be produced in a high yield.

However, in order to obtain crystals of good quality by molecular beam epitaxy, molecular beam intensity must be controlled with accuracy. For example, in the growth of crystals for semiconductors with elements in the range of Groups III to V or Groups II to VI of the periodic table, when both the vapor pressure and the substrate temperature are high, many problems arise with the control of the elements in Groups V and VI both of which have a low effective adhesion coefficients for the substrate. For example, in the growth of InP, when the temperature of the substrate is high, the P revaporizes, and the P pressure must be raised. However, when the P pressure of the growth chamber in which the epitaxial growth is being carried out is too high, there are problems in maintaining the growth chamber at a perfect vacuum. For this reason, substrate temperatures generally used are under 600° C. When a solid source of P is used, a molecular beam of $P_4$ molecules is employed. At such low substrate temperatures, a high sticking efficiency of the $P_4$ molecules to the surface of the substrate cannot be achieved, so that good quality crystals cannot be obtained. Thus, a $P_4$ molecular beam once obtained passes through a cell containing a decomposing furnace in which the $P_4$ molecular beam is converted to a $P_2$ molecular beam by passage through the high heat of a furnace, in the range of about 800°–1000° C.

On the other hand, in crystals containing Al, such as GaAlAs, increasing the substrate temperature attains better crystallinity. Thus, since the substrate temperature cannot be raised for crystals containing both Al and P such as InAlP, good quality crystals cannot be obtained. Moreover, when the cell attached to a high temperature decomposing furnace is used, new contamination problems may be caused by at least tantalum and carbon, which are contained in the furnace materials, due to the high temperature of the decomposing furnace. Moreover, there are various other drawbacks such as difficulty of temperature control of the decomposing furnace and difficulty in setting up the apparatus required for heat-insulation between the high temperature decomposing furnace zone and the low temperature solid source zone.

SUMMARY OF THE INVENTION

The apparatus for the molecular beam epitaxial growth of semiconductor crystals of this invention which overcomes the above-discussed and numerous other disadvantages and deficiencies of the prior art, comprises a molecular beam epitaxial growth chamber containing a substrate on which semiconductor crystals are grown by molecular beam epitaxy, said chamber comprising an optical window through which light is introduced into said growth chamber and irradiates the surface of said substrate during molecular beam epitaxial growth.

The optical window is, in a preferred embodiment, mounted on the molecular beam epitaxial growth chamber by a vacuum port containing a cooling means therein, and comprising a window substance and a heater disposed around said window substance for heating said window substance, so that clouding of the window surface by vaporized elements produced under the high pressure can be prevented.

Thus, the invention described herein makes possible the objects of (1) providing a novel apparatus for the growth of semiconductor crystals in which the surface of a substrate is irradiated with light during the molecular beam epitaxial growth of the semiconductor crystals to thereby accelerate both the reaction between the substrate and the molecules of the molecular beam and the decomposition of the molecules of the molecular beam, thereby eliminating the limitations imposed on the temperature of the substrate and the kinds of molecules of the molecular beam and also supplying better quality crystals by molecular beam epitaxy than can be provided by liquid phase epitaxy; and (2) providing an apparatus for the growth of semiconductor crystals which comprises a molecular beam epitaxial growth chamber equipped with an optical window by means of a vacuum port containing a cooling means therein, said optical window being composed of a window substance and a heater for heating the window substance, thereby preventing the window substance from being clouded by vaporized elements.

BRIEF DESCRIPTION OF THE DRAWING

This invention may be better understood and its numerous objects and advantages will become apparent to those skilled in the art by reference to the accompanying drawing as follow.

DESCRIPTION OF THE PREFERRED EMBODIMENTS

Figure 1:
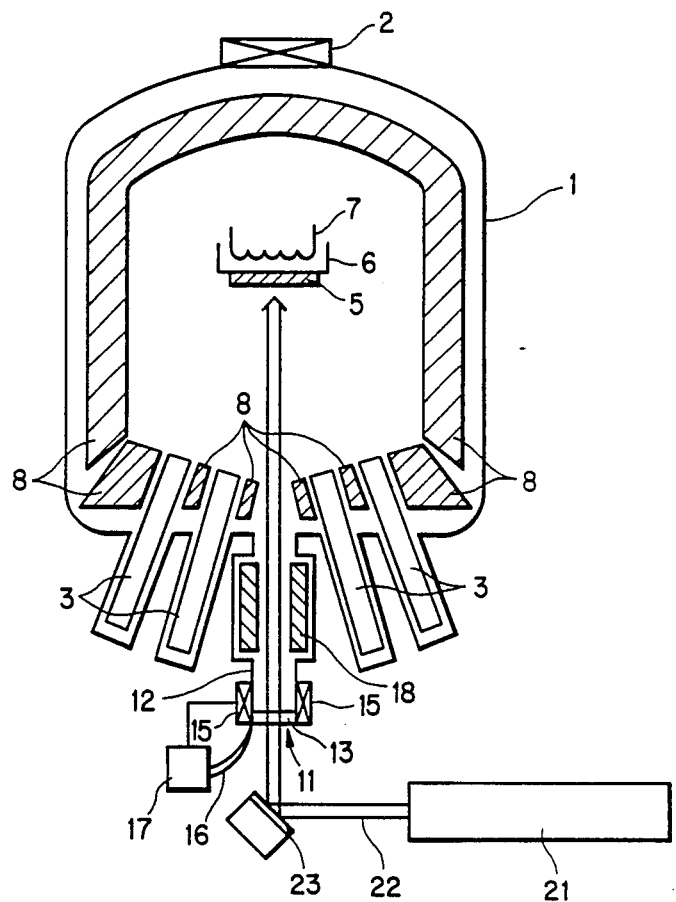
FIG. 1 is a schematic diagram showing the apparatus for the growth of semiconductor crystals according to this invention.

FIG. 1 shows an apparatus for the growth of semiconductor crystals, which comprises a molecular beam epitaxial growth chamber 1 connected to a sample pre-preparation chamber (not shown) by means of a gate valve 2, an optical window 11, a cylindrical vacuum port 12 for mounting the optical window 11 on the growth chamber 1, and a light source 21 for the introduction of laser light into a substrate 5, through the optical window 11, disposed within the growth chamber 1.

Semiconductor crystal materials which are grown on the substrate 5 to form semiconductor thin films are charged into Knudsencells 3 within the growth chamber 1. The substrate 5 is supported by a molybdenum block 6 and heated by a heater 7 behind the molybdenum block 6.

The substrate 5, the block 6 and the heater 7 are all surrounded by liquid nitrogen shrouds 8 within the growth chamber 1.

The optical window 11 comprises a window substance 13 of quartz and a heater 15 surrounding the window substance 13 for heating the window substance 13. The heater 15 is maintained at a certain temperature by the combination of a thermocouple 16 and a thermocontroller 17 achieving a PID (proportional integral differential) control. The above-mentioned cylindrical vacuum port 12 contains a cylindrical liquid nitrogen shroud 18 therein as a cooling means.

During molecular beam epitaxial growth in the growth chamber 1, the laser light 22 of KrF with a wavelength of 248 nm emitted from an Excimer laser 21 passes through the window substance 13 of the optical window 11 by means of a beamscanner 23 with a galvanomirror and reaches the surface of the substrate 5. In this manner, the surface of the substrate 5 is irradiated with the laser light 22 having a high energy during the molecular beam epitaxial growth, causing the acceleration of both the reaction between the substrate 5 and the molecules of the molecular beam and the decomposition of the molecules of the molecular beam. Since these reactions are non-thermal equilibrium reactions, the resulting crystals on the substrate 5 is of good quality. Moreover, since the vaporized elements under high pressure are effectively absorbed by the liquid nitrogen shroud 18 within the vacuum port 12 during the molecular beam epitaxial growth, almost no vaporized elements reach the window substance 13. Even though some of the vaporized elements reach the window substance 13, since the window substance 13 is heated by the heater 15, they will revaporize and become incorporated into the liquid nitrogen shroud 18 due to the temperature difference therebetween. Therefore, clouding of the window surface by vaporized elements produced under the high pressure can be prevented.

When either the quartz of the window substance 13 liberating a relatively large amount of gas therefrom or the stainless steel frame holding the window substance 13 therein is heated by the heater 15, contamination gases such as CO, etc., are liberated. However, these gases are effectively absorbed by the liquid nitrogen shroud 18, and cannot reach the substrate 5. Thus, the cleanliness of the substrate 5 can be maintained.

Although the above-mentioned example discloses quartz alone as a material for the window substance 13, it is not limited thereto. As the material for the window substance 13, $CaF_2$, $MgF_2$, etc., can be selected depending upon the wavelength of the light source used. The wavelength of the light source can be selected by the use of other Excimer lasers, mercury lamps or the like.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. An apparatus for the growth of semiconductor crystals in which the surface of a substrate is irradiated with molecular beam containing elements by which semiconductor thin films are formed on the substrate within a molecular beam epitaxial growth chamber in a high vacuum, thereby achieving molecular beam epitaxial growth of semiconductor thin films onto the substrate, wherein said molecular beam epitaxial growth chamber comprises an optical window through which light is introduced into said growth chamber and irradiates the surface of said substrate during molecular beam epitaxial growth, and wherein said optical window is mounted on the molecular beam epitaxial growth chamber by a vacuum port containing a cooling means therein, and comprises a window substance and a heater disposed around said window substance for heating said window substance.

* * * * *